United States Patent

Kwok et al.

[11] Patent Number: 5,903,042
[45] Date of Patent: May 11, 1999

[54] SELF-ALIGNED ANTIFUSE WITH BASE

[75] Inventors: Siang Ping Kwok, Dallas, Tex.; Peter J. Wright, Sunnyvale, Calif.

[73] Assignee: Texas Instruments Incorporated, Dallas, Tex.

[21] Appl. No.: 08/873,943

[22] Filed: Jun. 12, 1997

[51] Int. Cl.[6] .................................................. H01L 29/00
[52] U.S. Cl. ............................ 257/530; 257/50; 438/600
[58] Field of Search ............................ 257/50, 529, 530; 438/600

[56] References Cited

U.S. PATENT DOCUMENTS

| | | | |
|---|---|---|---|
| 5,384,481 | 1/1995 | Holzworth et al. | 257/530 |
| 5,493,147 | 2/1996 | Holzworth et al. | 257/530 |
| 5,510,646 | 4/1996 | Forouhi et al. | 257/530 |
| 5,521,440 | 5/1996 | Iranmanesh | 257/774 |
| 5,543,656 | 8/1996 | Yen et al. | 257/530 |
| 5,614,756 | 3/1997 | Forouhi et al. | 257/530 |
| 5,693,556 | 12/1997 | Cleeves | 438/600 |

*Primary Examiner*—Valencia Martin-Wallace
*Attorney, Agent, or Firm*—Jacqueline J. Garner; W. James Brady, III; Richard L. Donaldson

[57] ABSTRACT

A method of integrating a low aspect ratio antifuse into low capacitance interconnect levels which involves fabrication of an antifuse base which is self-aligned to either a lower interconnect level or the antifuse dielectric. The method provides maximum allowable registration tolerance for the antifuse onto its base without incurring any increase in the pitch of the interconnect. The antifuse base is required to minimize the capacitance between the lower and upper interconnect levels. This is accomplished by providing over a lower interconnect pattern, such as, for example, aluminum over titanium tungstide (TiW), a barrier metal, such as, for example, TiW. The barrier metal separates one of the interconnect layers from the amorphous silicon dielectric. The barrier metal also acts as a raised base for the antifuse, providing increased spacing between the upper and lower interconnect patterns, thereby minimizing the capacitance therebetween.

6 Claims, 3 Drawing Sheets

SELF-ALIGNED ANTIFUSE WITH BASE

BACKGROUND OF THE INVENTION

1. Field of the Invention

This invention relates to antifuses and, more specifically, to a method of fabricating an antifuse for use as part of an integrated circuit.

2. Brief Description of the Prior Art

Scaling of metal-to-metal antifuses can cause increased capacitance between adjacent metal layers along with high aspect ratio in the case of via antifuses. The increased capacitance decreases the operating speed of the circuit and the high aspect ratio decreases the yield and reliability of the antifuse.

Prior art solutions to the problem have been to directly integrate the antifuse on the bottom interconnect metal without an antifuse base. As a result, in order to maintain a sufficient separation between interconnect levels for minimal capacitance and adequate breakdown voltage, a high aspect ratio antifuse must be used having a depth equal to the thickness of the intermetal dielectric (IMD). A high aspect ratio antifuse causes severe corner cusping and nonuniformity of the amorphous silicon and results in nonuniform breakdown voltage of the antifuse. Formation of a non-self-aligned base for the antifuse increases the width of the host metal or suffers from yield loss due to tighter registration requirements.

In view of the above, in the fabrication of integrated circuits having an antifuse, it has been found desirable to provide a base for the antifuse due to unwanted capacitance that can be generated if the antifuse rests on the metal therebelow. Preferably, the antifuse is spaced sufficiently from the metal therebelow to provide low capacitance. A problem with provision of a large space between the antifuse and the metal therebelow has been the inability to provide a self-aligning structure. Accordingly, there is a penalty incurred in the form of a second alignment step.

SUMMARY OF THE INVENTION

In accordance with the present invention, the above described problems inherent in prior art antifuses are minimized by providing a low aspect ratio antifuse integrated into low capacitance interconnect levels and a method of forming such an antifuse. The invention comprises a first interconnect layer, an antifuse base, an antifuse dielectric and an second interconnect layer. The antifuse base comprises a refractory metal barrier material that is self-aligned to another portion of the antifuse. The conductive antifuse base effectively reduces the aspect ratio of the antifuse and allows for low capacitance interconnect levels. In a first embodiment of the invention, the antifuse base is self-aligned to the first interconnect layer. In a second embodiment of the invention, the antifuse base is deposited over the antifuse dielectric and is self-aligned to the antifuse dielectric. In a third embodiment of the invention, the antifuse base is self-aligned to the first interconnect layer and the antifuse dielectric is self-aligned to the antifuse base.

An advantage of the invention is providing an antifuse that may be, integrated into low capacitance interconnect levels.

A further advantage of the invention is providing an antifuse having an effectively lower aspect ratio to increase yield and reliability.

A further advantage of the invention is providing an antifuse having self-aligned layers to reduce the alignment tolerances necessary to form the antifuse.

These and other advantages will be apparent to those of ordinary skill in the art having reference to the specification in conjunction with the drawings and claims.

DESCRIPTION OF THE PREFERRED EMBODIMENT

Figure 1A:
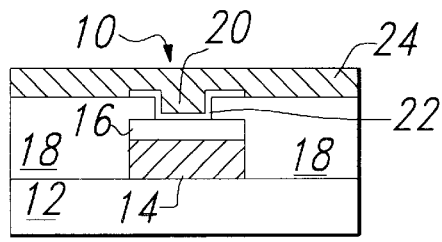
FIGS. 1a&b are cross-sectional views from a front and side view respectively, of an antifuse according to a first embodiment of the invention.

FIGS. 1a&b are cross-sectional front and side views, respectively, of an antifuse 10 according to a first embodiment of the invention. Antifuse 10 is formed on an interlayer dielectric 12. Interlayer dielectric 12 is the top layer of a semiconductor body in which other devices such as transistors (not shown) may be formed. A first interconnect layer 14 is formed on the interlayer dielectric 12. Interconnect layer 14 may be a conventional interconnect layer. For example, interconnect layer 14 may comprise a layer of barrier metal material such as titanium tungsten (TiW) with an overlying layer of aluminum.

Figure 1B:
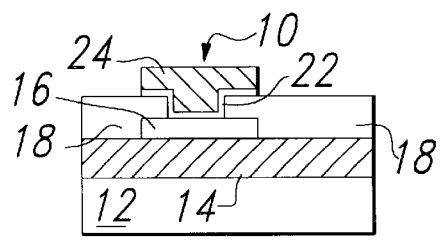

Above interconnect layer 14 is an antifuse base 16. Antifuse base 16 comprises a refractory metal barrier material or its compound, such as TiW or TiN. As shown in FIG. 1a, the antifuse base 16 is self-aligned with interconnect layer 14 in one direction. However, antifuse base 16 covers the portion of interconnect layer 14 where the antifuse is to be formed, as shown in FIG. 1b. The purpose of antifuse base 16 is to add vertical distance to the bottom electrode of the antifuse. Instead of consisting only of interconnect layer 14, the bottom electrode of antifuse 10 consists of both interconnect layer 14 and antifuse base 16. This reduces the effective aspect ratio of the antifuse 10 and allows for low capacitance interconnect layers (i.e. interconnect layers that are vertically spaced further apart). The advantage of having antifuse base 16 self-aligned to the first interconnect layer is that the alignment tolerances are increased, thus easing manufacture, while maintaining low capacitance interconnect and increased reliability.

An interlevel dielectric layer 18 covers the interlayer dielectric 12, first interconnect layer 14 and antifuse base 16, except where via 20 is located. An antifuse dielectric 22, preferably comprising amorphous silicon, is located within the via 20 and on the edges of interlevel dielectric 18 adjacent the via 20. The second interconnect layer 24 is then formed over via 20. A portion of second interconnect layer 24 extends into an fills via 20. Because of antifuse base 16, the first (14) and second (24) interconnect layers can be spaced further apart to lower interconnect capacitance. As discussed above, antifuse base 16 adds vertical distance to the bottom electrode of the antifuse 10, reducing the aspect ratio of the antifuse.

In operation, when a sufficiently high voltage is placed across the first and second interconnect layers 14 and 24, antifuse 10 transitions from a non-conducting state to a conducting state. This occurs because the electrically insulating antifuse dielectric (e.g. amorphous silicon) breaks down and reacts with the refractory metal of the antifuse base 16 and interconnect layer 24 to form a silicide. Silicide is electrically conductive and stable and the antifuse 10 thus becomes conductive.

Figure 2A:
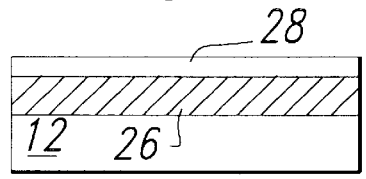
FIGS. 2a&b to 5a&b are cross-sectional views of the antifuse of FIG. 1 during various stages of fabrication, with FIGS. 2a–5a being front views and FIGS. 2b–5b being side views.
Figure 2B:
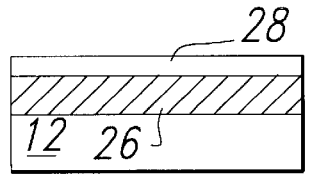

A method for forming antifuse 10 according to a first embodiment of the invention will now be described with reference to FIGS. 2a&b through 5a&b, with "a" figures representing a front view and "b" figures representing a side view. Referring to FIGS. 2a&b, a layer of interconnect material 26 is deposited over the surface of dielectric layer 12. Interconnect material 26 preferably comprises a layer of barrier metal such a TiW and an overlying layer of aluminum. The barrier metal may be on the order of 300 nm thick and the aluminum may be on the order of 600 nm thick. A layer of refractory metal barrier material 28 is then deposited over interconnect material 26. Barrier material 28 preferably comprises TiW, but other refractory metals and their compounds may alternatively be used. Barrier material 28 may be on the order of 300 nm thick.

Figure 3A:
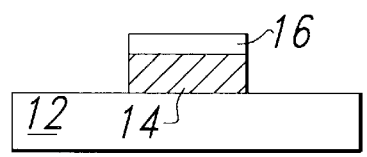
Figure 3B:
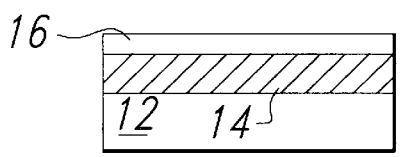
Figure 4A:
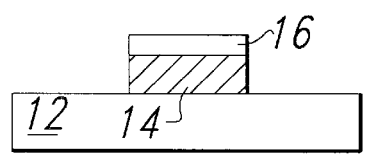
Figure 4B:
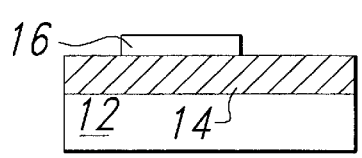

Referring to FIGS. 3a&b, the barrier material 28 and interconnect material 26 are then patterned and etched to create interconnect layer 14. At this point, barrier material 28 completely covers interconnect layer 14 and is self-aligned to interconnect layer 14 on all sides. Then, barrier material 28 is patterned and etched to form antifuse base 16, as shown in FIGS. 4a&b. During this etch, barrier material 28 is removed from the surface of interconnect layer 14 except where antifuse 10 is to be located, as shown in FIG. 4b. As shown in FIG. 4a, antifuse base 16 is self-aligned to the interconnect layer 14 in the narrow (width) dimension of interconnect layer 14.

Figure 6A:
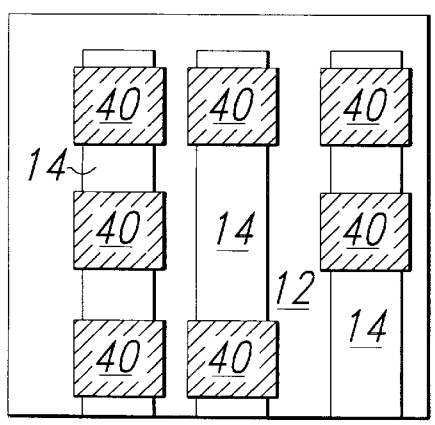
FIGS. 6a&b are top views of the antifuse of FIG. 1 during the antifuse base etch patterning illustrating alternative patterns.
Figure 6B:
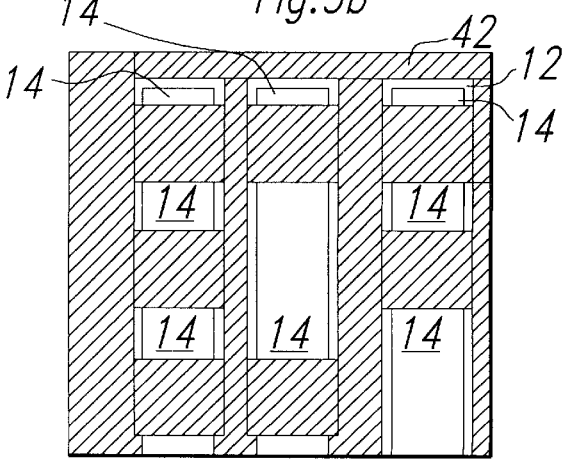

One method for accomplishing self-alignment is to provide a pattern 40 for the antifuse base etch that overlaps the edges of interconnect layer 14 in the narrow dimension as shown in FIG. 6a. The narrow dimension, or width, of the interconnect layer 14 is the dimension for which self-alignment is desired. Using pattern 40, some etching of the dielectric layer 12 occurs. The amount of dielectric layer 12 removed depends on the etch selectivity between the barrier material 28 and dielectric layer 12. If etch selectivity between barrier material 28 and dielectric layer 12 causes an unacceptable amount of dielectric layer 12 to be removed, a more complicated pattern 42 may be used, such as that shown in FIG. 6b. Pattern 42 covers most of dielectric layer 12, but leaves some unprotected regions along the perimeters of the interconnect layer 14. While this allows overetching of the dielectric layer 12 in these unprotected areas, such localized trenching has minimal effect on subsequent planarization steps.

Figure 5A:
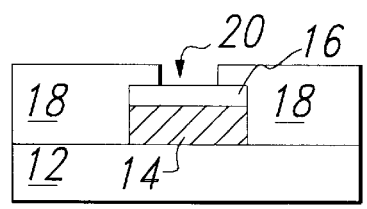
Figure 5B:
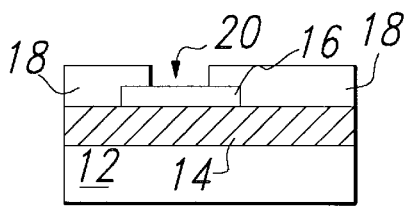

Next, an interlevel dielectric 18 is deposited over the surface of the structure. Then, a via 20 is patterned and etched through interlevel dielectric layer 18 where the antifuse 10 is to be formed, as shown in FIGS. 5a&b. It should be noted that antifuse base 16 extends past the edges of via 20 to allow for alignment tolerances. This increases the yield and reliability of the antifuse.

Referring back to FIGS. 1a&b, the antifuse dielectric material isthen deposited patterned and etched to form the antifuse dielectric 22 within the via 20 and on the edges of interlevel dielectric layer 18 adjacent via 20. Finally, the second interconnect layer is formed. The second interconnect layer 24 also preferably comprises a barrier layer (on the order of 300 nm) and an overlying layer of aluminum (on the order of 600 nm).

Figure 7A:
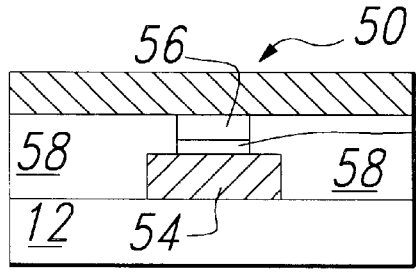
FIGS. 7a&b are cross-sectional views from a front an side view respectively, of an antifuse according to second embodiment of the invention.
Figure 7B:
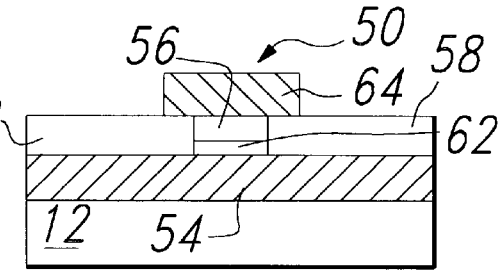

An antifuse 50 according to a second embodiment of the invention is shown in FIG. 7a&b. Antifuse 50 is formed on a dielectric layer 12. As in the first embodiment, dielectric layer 12 is the top layer of a semiconductor body in which other devices such as transistors (not shown) may be formed. A first interconnect layer 54 is formed on the dielectric layer 12. Interconnect layer 54 may be a conventional interconnect layer. For example, interconnect layer 54 may comprise a layer of barrier metal material such as titanium tungsten (TiW) with an overlying layer of aluminum.

Above interconnect layer 54 is an antifuse dielectric 62 and an interlevel dielectric layer 58. The interlevel dielectric layer 58 covers the dielectric layer 12 and the portion of first interconnect layer 54 that is not covered by antifuse dielectric 62. The antifuse dielectric 62 preferably comprises amorphous silicon and is directly on interconnect layer 54. The width of antifuse dielectric 62 determines the electrical size of the antifuse.

An antifuse base 56 is located above and is self-aligned to antifuse dielectric 62. Antifuse base 56 comprises a refractory metal barrier material or its compound, such as TiW or TiN. The purpose of antifuse base 56 is to add vertical distance to the top electrode of the antifuse 50. Instead of consisting only of the second interconnect layer 64, the top electrode of antifuse 50 consists of both second interconnect layer 64 and antifuse base 56. This allows for low capacitance interconnect layers (i.e. interconnect layers that are vertically spaced further apart). The advantage of having antifuse base 56 self-aligned to the antifuse dielectric is that the base and antifuse dielectric are patterned and etched simultaneously while maintaining low interconnect capacitance.

The second interconnect layer 64 is then formed over antifuse base 56. Because of antifuse base 56, the first (54) and second (64) interconnect layers can be spaced further apart to lower interconnect capacitance.

Figure 8A:
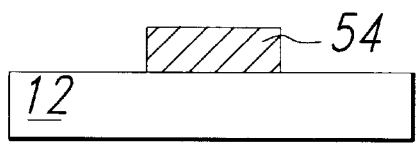
FIGS. 8a&b–11a&b are cross-sectional views of the antifuse of FIG. 7 during various stages of fabrication, with FIGS. 8a–11a being front views and FIGS. 8b–11b being side views.
Figure 8B:
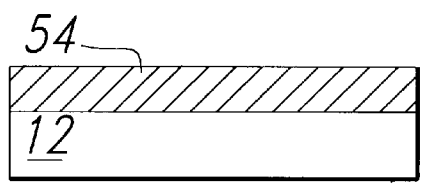

A method of forming antifuse 50 will now be discussed with respect to FIGS. 8a&b–11a&b. Referring to FIGS. 8a&b, a layer of interconnect material is deposited over the surface of dielectric layer 12. The interconnect material preferably comprises a layer of barrier metal such a TiW, an overlying layer of aluminum, and a top layer of barrier metal. Both barrier metal layers may be on the order of 300 nm thick and the aluminum may be on the order of 600 nm thick. The interconnect material is then patterned and etched in the conventional manner to form interconnect layer 54.

Figure 9A:
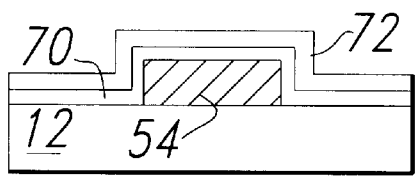
Figure 9B:
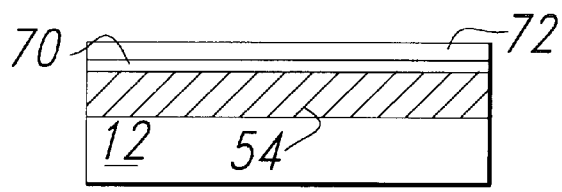

Referring to FIGS. 9a&b, a layer of antifuse dielectric material 70 is deposited over the surface of the structure. Antifuse dielectric material 70 preferably comprises amorphous silicon at a thickness on the order of 100 nm. Then, a layer of refractory metal barrier material 72 is deposited over the antifuse dielectric material 70. Similar to the first embodiment, barrier material 72 preferably comprises TiW, but other refractory metals and their compounds may alternatively be used. Barrier material 72 may be on the order of 300 nm thick.

Figure 10A:
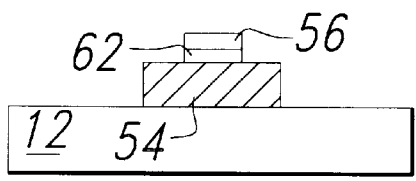
Figure 10B:
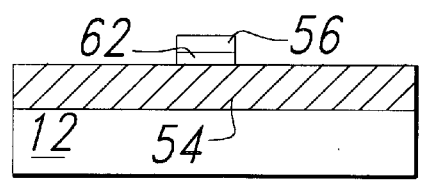

Barrier material 72 and antifuse dielectric material 70 are then patterned and etched to form the antifuse base 56 and antifuse dielectric 62 respectively, as shown in FIGS. 10a&b. Because the same pattern is used for both the antifuse base etch and antifuse dielectric etch, the antifuse base 56 is self-aligned to the antifuse dielectric 62. Accordingly, an additional alignment tolerance for the antifuse base is not required.

Figure 11A:
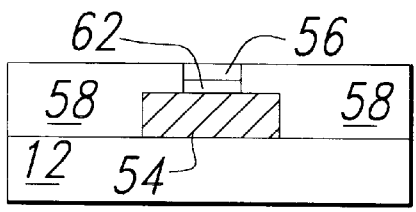
Figure 11B:
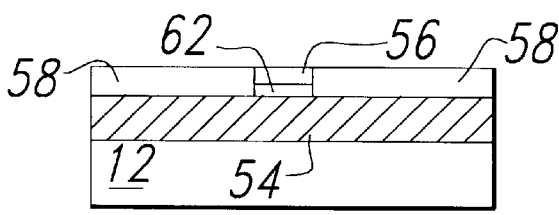

Referring to FIGS. 11a&b, an interlevel dielectric 58 is deposited over the surface of the structure. Interlevel dielectric layer 58 is then planarized and etched-back to expose to surface of the antifuse base 56. Finally, the second interconnect layer 64 is deposited, patterned and etched. Second interconnect layer 64 covers antifuse base 56. Antifuse base 56 and second interconnect layer 64 form the top electrode of the antifuse 50. Antifuse base 56 extends the top antifuse electrode down in the vertical directions allowing the first and second interconnect layers to be vertically spaced sufficiently apart for low capacitance.

Figure 12A:
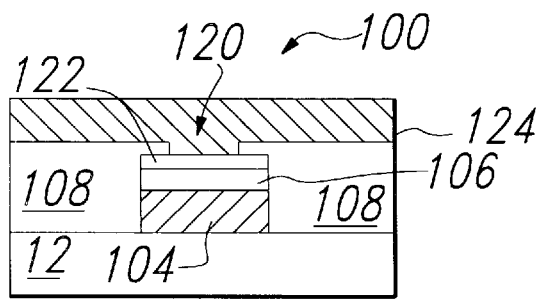
FIGS. 12a&b are cross-sectional views from a front and side view respectively, of an antifuse according to a third embodiment of the invention.

FIGS. 12a&b are cross-sectional front and side views, respectively, of an antifuse 100 according to a third embodiment of the invention. Antifuse 100 is formed on a dielectric layer 12. As in the other embodiments, dielectric layer 12 is the top layer of a semiconductor body in which other devices such as transistors (not shown) may be formed. A first interconnect layer 104 is formed on the dielectric layer 12. First interconnect layer 104 may be a convention interconnect layer. For example, interconnect layer 104 may comprise a layer of barrier metal material such as titanium tungsten (TiW) with an overlying layer of aluminum.

Figure 12B:
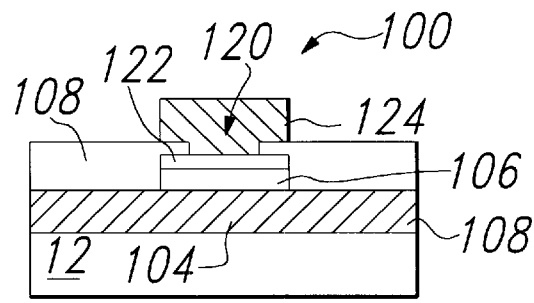

Above interconnect layer 104 is an antifuse base 106. Antifuse base 106 comprises a refractory metal barrier material or its compound, such as TiW or TiN. As shown in FIG. 12a, the antifuse base 106 is self-aligned with interconnect layer 104 in one direction. However, antifuse base 106 covers only a portion of interconnect layer 104 where the antifuse 100 is to be formed, as shown in FIG. 12b. The purpose of antifuse base 106 is to add vertical distance to the bottom electrode of the antifuse 100. Instead of consisting only of interconnect layer 104, the bottom electrode of antifuse 100 consists of both interconnect layer 104 and antifuse base 106. This allows for low capacitance interconnect layers (i.e. interconnect layers that are vertically spaced further apart). The advantage of having antifuse base 106 self-aligned to the first interconnect layer is low interconnect capacitance with simultaneous patterning and etching of the base and antifuse dielectric.

An antifuse dielectric 122 is also self-aligned to the antifuse base 106 and first interconnect layer 104 in one direction. Antifuse dielectric 122 preferably comprises amorphous silicon. An interlevel dielectric layer 108 covers the dielectric layer 12, first interconnect layer 104 and a portion of antifuse dielectric 122 except where via 120 is located. The second interconnect layer 124 is then formed over via 120. A portion of second interconnect layer 124 extends into an fills via 120. Because of antifuse base 106, the first (104) and second (124) interconnect layer can be spaced further apart to lower interconnect capacitance.

In operation, when a sufficiently high voltage is placed across the first and second interconnect layers 104 and 124, antifuse 100 transitions from a non-conducting state to a conducting state. This occurs because the electrically insulating antifuse dielectric (e.g. amorphous silicon) 122 breaks down and reacts with the refractory metal of the antifuse base 106 and interconnect layer 124 to form a silicide. Silicide is electrically conductive and stable and the antifuse 100 thus becomes conductive.

Figure 13A:
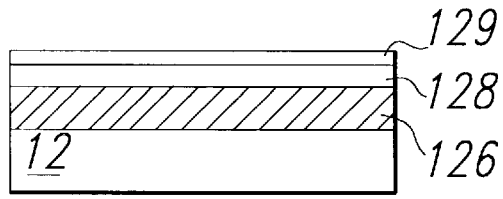
FIGS. 13a&b–16a&b are cross-sectional views of the antifuse of FIG. 12 during various stages of fabrication, with FIGS. 13a–16a being front views and FIGS. 13b–16b being side views.
Figure 13B:
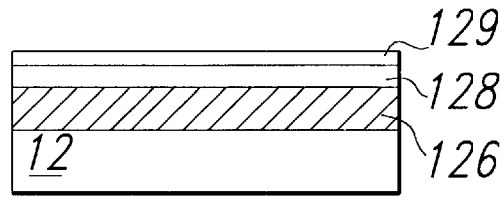

A method for forming antifuse 100 according to a third embodiment of the invention will now be described with reference to FIGS. 13a&b through 16a&b, with "a" figures representing a front view and "b" figures representing a side view. Referring to FIGS. 13a&b, a layer of interconnect material 126 is deposited over the surface of dielectric layer 12. Interconnect material 126 preferably comprises a layer of barrier metal such a TiW and an overlying layer of aluminum. The barrier metal may be on the order of 300 nm thick and the aluminum may be on the order of 600 nm thick. A layer of refractory metal barrier material 128 is then deposited over interconnect material 126. Barrier material 128 preferably comprises TiW, but other refractory metals and their compounds may alternatively be used. Barrier material 128 may be on the order of 300 nm thick. Then, a layer of antifuse dielectric material 129, for example amorphous silicon, is deposited over the barrier material 128.

Figure 14A:
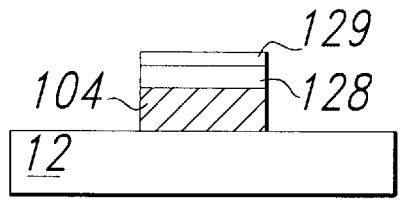
Figure 14B:
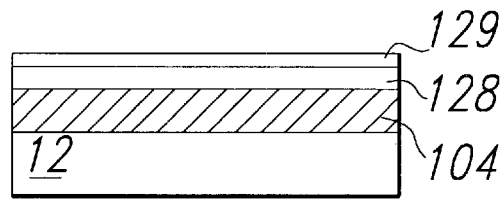
Figure 15A:
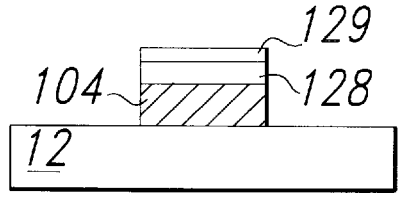
Figure 15B:
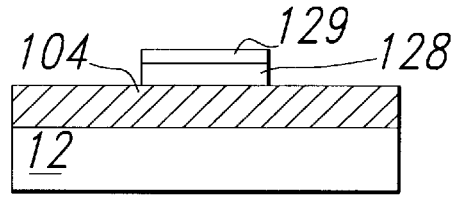

Referring to FIGS. 14a&b, the antifuse dielectric material 129, the barrier material 128 and interconnect material 126 are then patterned and etched to create interconnect layer 104. At this point, antifuse dielectric material 129 and barrier material 128 completely cover interconnect layer 104 and are self-aligned to interconnect layer 104 on all sides. Then, antifuse dielectric material 129 and barrier material 128 are patterned and etched to form antifuse base 106 and antifuse dielectric 122, as shown in FIGS. 15a&b. During this etch, antifuse dielectric material 129 and barrier material 128 are removed from the surface of interconnect layer 104 except where antifuse 100 is to be located, as shown in FIG. 15b. As shown in FIG. 15a, antifuse base 106 is self-aligned to the interconnect layer 104 in the narrow (width) dimension. As in the first embodiment, patterns similar to those shown in FIGS. 6a&b may be used for this etch to achieve the self-alignment. For self-alignment, it is important that the pattern overlaps the edges of interconnect layer 104.

Figure 16A:
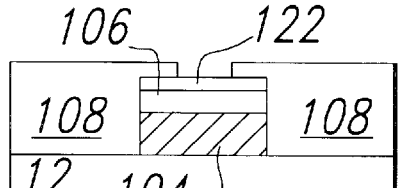
Figure 16B:
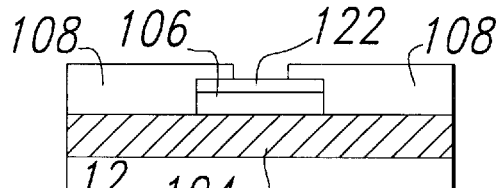

Next, an interlevel dielectric 108 is deposited over the surface of the structure. Then, a via 120 is patterned and etched through interlevel dielectric layer 108 where the antifuse 100 is to be formed, as shown in FIGS. 16a&b. It should be noted that antifuse base 106 and antifuse dielectric 122 extend past the edges of via 120 to allow for alignment tolerances. This increases the yield and reliability of the antifuse. Finally, the second interconnect layer 124 is formed. The second interconnect layer 124 also preferably comprises a barrier layer (on the order of 300 nm) and an overlying layer of aluminum (on the order of 600 nm).

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. An antifuse comprising:

a first interconnect layer;

a layer of barrier metal self aligned in one dimension to said first interconnect layer and covering only a portion of said first interconnect layer;

an antifuse dielectric located on said layer of barrier metal; and a second interconnect layer extending over said antifuse dielectric.

2. The antifuse of claim 1, wherein said antifuse dielectric is self-aligned to said first layer of metal.

3. The antifuse of claim 1, wherein said antifuse dielectric comprises amorphous silicon.

4. The antifuse of claim 1, wherein said layer of barrier metal comprises titanium-tungsten.

5. The antifuse of claim 1, further comprising:

an interlevel dielectric over said first interconnect layer and a portion of said barrier layer; and a via extending through said interlevel dielectric to said layer of barrier metal, wherein said antifuse dielectric is located in said via.

6. The antifuse of claim 1, wherein said first and second interconnect layers comprise an titanium-tungsten and aluminum stack.

* * * * *

UNITED STATES PATENT AND TRADEMARK OFFICE
CERTIFICATE OF CORRECTION

PATENT NO. : 5,903,042
DATED : May 11, 1999
INVENTOR(S) : Kwok et al.

It is certified that error appears in the above-identified patent and that said Letters Patent is hereby corrected as shown below:

On the title page, between items [22] and [51], insert the following:

Related U.S. Application Data
--[60] Provisional application No. 60/020,342, Jun. 19, 1996--.

Column 1, line 2, insert the following:

-- This application claims priority under 35 USC § 119(e) (1) of provisional application number 60/020,342, filed Jun. 19, 1996.--.

Signed and Sealed this

Second Day of May, 2000

Attest:

Q. TODD DICKINSON

*Attesting Officer*           *Director of Patents and Trademarks*